United States Patent [19]

Takano et al.

[11] Patent Number: 4,704,040

[45] Date of Patent: Nov. 3, 1987

[54] MEMORY DEVICE AND PRINTING SYSTEM FOR DOT PRINTER

[75] Inventors: Hirokuni Takano; Toshiro Suemune; Tadao Shimizu, all of Tokyo, Japan

[73] Assignee: Oki Electric Industry Co., Ltd., Tokyo, Japan

[21] Appl. No.: 18,816

[22] Filed: Feb. 19, 1987

Related U.S. Application Data

[63] Continuation of Ser. No. 741,614, Jun. 5, 1985, abandoned.

[30] Foreign Application Priority Data

Jun. 5, 1984 [JP] Japan ............................. 59-113816

[51] Int. Cl.$^4$ ............................................... B41J 3/12
[52] U.S. Cl. ................................... 400/121; 101/93.04; 400/124
[58] Field of Search .................... 400/70, 121, 124; 101/93.04, 93.05; 340/728

[56] References Cited

U.S. PATENT DOCUMENTS

| | | | |
|---|---|---|---|
| 3,185,823 | 5/1965 | Ellersick | 375/122 X |
| 4,458,333 | 7/1984 | Smith | 400/121 X |
| 4,468,141 | 8/1984 | Rosza | 400/121 X |

FOREIGN PATENT DOCUMENTS

| | | | |
|---|---|---|---|
| 0090140 | 10/1983 | European Pat. Off. | 400/121 |
| 1487048 | 9/1977 | United Kingdom | 400/121 |
| 1504607 | 3/1978 | United Kingdom | 400/121 |
| 2112979B | 7/1983 | United Kingdom | 400/121 |

OTHER PUBLICATIONS

*IBM Tech. Disc. Bulletin,* by B. Bechtle, vol. 25, No. 12, May 1983, pp. 6648–6650.

Primary Examiner—Paul T. Sewell
Attorney, Agent, or Firm—Wenderoth, Lind & Ponack

[57] ABSTRACT

A printing system for a dot printer for printing matrix patterns in the form of aggregated dots which consist of orthogonal rows and columns, has a first memory having first and second memory areas for storing pattern data corresponding to the rows and columns of the dot matrix patterns. The data corresponding to successive columns of each one of the dot matrix patterns are stored in the first memory area and numerical data specifying a total number of times each respective successive column is to be repeated in the respective pattern are stored in the second memory area. A second memory temporarily stores the dot matrix patterns specified by the pattern data and a control means causes the dot matrix patterns to be generated in the second memory in accordance with the pattern data stored in the first memory. Thus, when two adjacent successive columns are identical, the first memory need only once store data corresponding thereto so as to thereby reduce the amount of memory area needed for storing a dot matrix pattern having repeated identical successive columns.

2 Claims, 13 Drawing Figures

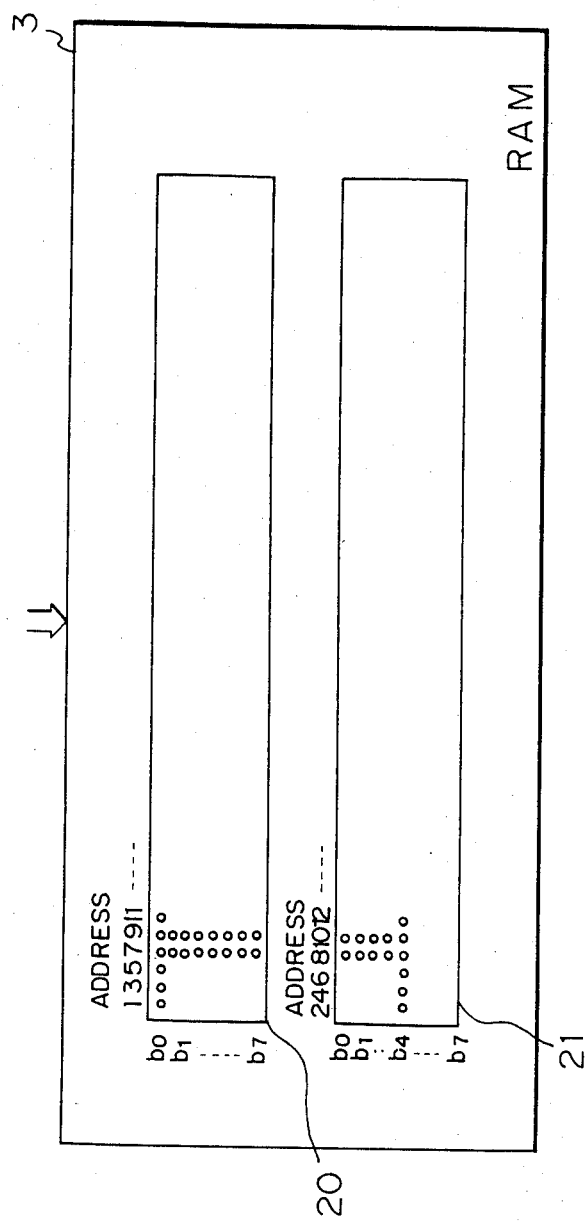

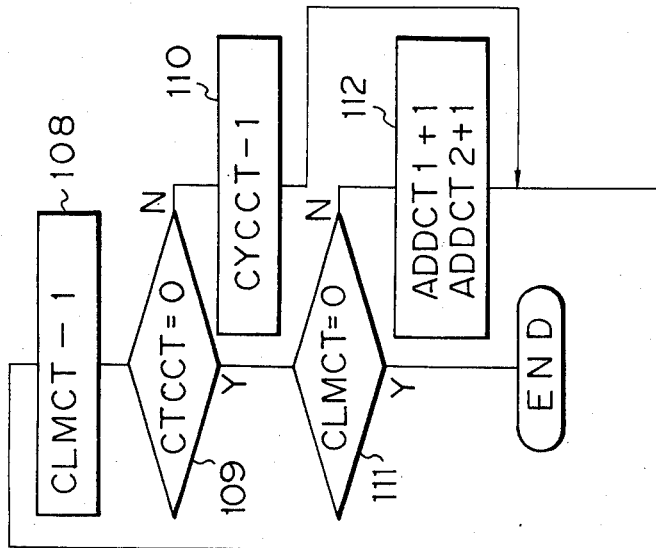
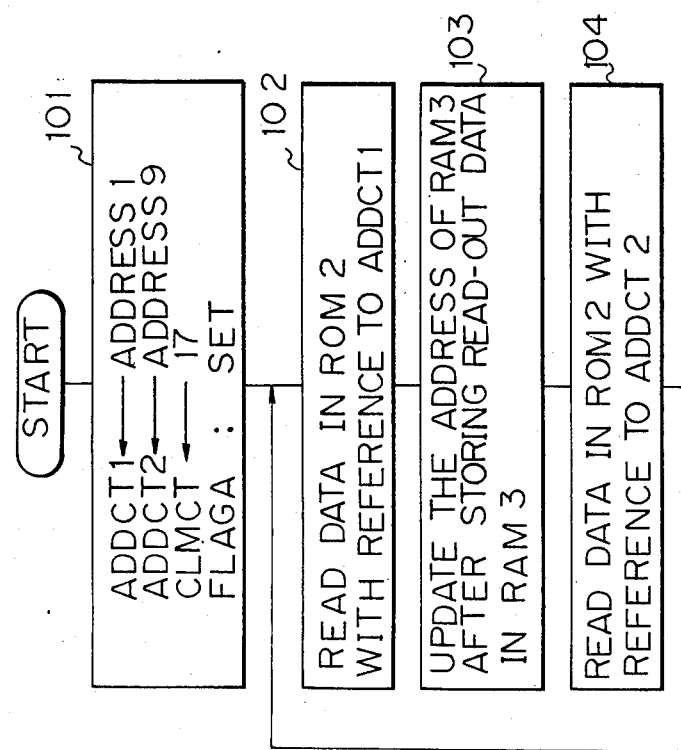
Fig. 10A

MEMORY DEVICE AND PRINTING SYSTEM FOR DOT PRINTER

This application is a continuation of application Ser. No. 741,614, filed June 5, 1985, now abandoned.

BACKGROUND OF THE INVENTION

The present invention relates to a memory device and a printing system for a dot printer which performs high-grade printing of characters, symbols and graphics in the form of aggregated dots.

Dot printers are well known in the art. Usually, a dot printer comprises seven vertically aligned printing wires which are advanced stepwise five times per character to form a substantially 5-by-7 dot matrix. This type of dot printer is provided with a memory device, which can store pattern data in the form of matrices, e.g., 5-by-7 matrices, similar to the dot matrix patterns of the characters, symbols and graphics noted above.

In recent years, dot printers have become increasingly popular in various fields such as offices and factories. For making high quality documents with such dot printers, there is a demand for providing an increasing variety of fonts for the dot printers. This dictates an increased storing capacity of the memory device which stores these fonts. For example, a storing capacity of 34 bytes per character is required for high quality printing in the case of a 17-by-13 dot matrix. The increase of storing capacity calls for increased space and also for additional expenditures for setting the memory device in the dot printer.

SUMMARY OF THE INVENTION

An object of the present invention is to provide a pattern data memory device requiring less storing capacity for high-grade printing.

Another object of the invention is to provide a printing system using the memory device with less storing capacity for high-grade printing.

A further object of the invention is to reduce the additional expenditures for setting the memory device in a printing system for high-grade printing.

According to the invention there are provided, as in the embodiments described herein, a pattern data storing memory device and a printing system using the memory device. The memory device has at least two memory areas, one for storing one column or one row of continuous identical data and other data of dot matrix patterns, and another for storing numerical data specifying the total quantity of the continuous identical data in connection with the column or row. The printing system has at least two memory devices, one for storing pattern data of dot matrix patterns, another for storing temporarily, the dot matrix patterns specified by the pattern data.

BRIEF DESCRIPTION OF THE DRAWINGS

FIG. 9 is a block diagram showing a portion of RAM shown in FIG. 1;

FIG. 10, comprising FIGS. 10A and 10B, is a flow chart illustrating a routine of a process of converting the pattern data in the ROM to the dot matrix pattern in the RAM.

DETAILED DESCRIPTION OF PREFERRED EMBODIMENTS

The invention will now be described in detail in conjunction with embodiments thereof illustrated in the accompanying drawings.

Figure 1:
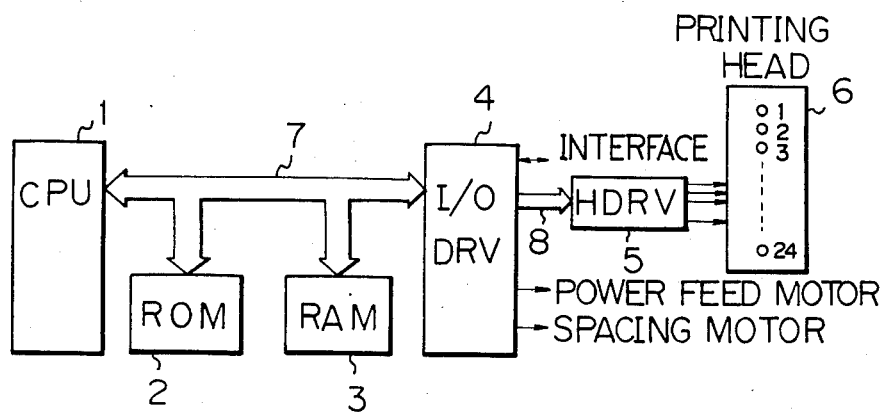
FIG. 1 is a schematic block diagram showing a printing system.

FIG. 1 is a schematic block diagram showing a printing system prepared in accordance with the present invention. Reference numeral 1 designates a microprocessor (hereinafter referred to as a "CPU") which controls the printing system. Reference numeral 2 designates a read-only memory (hereinafter referred to as a "ROM") which stores a control program of the operation of the printing system as well as pattern data of any dot matrix pattern. Reference numeral 3 designates a random-access memory (hereinafter referred to as a "RAM") which stores, temporarily, data received from external apparatus (not shown) as well as any dot matrix pattern. Reference numeral 4 designates an input/output driver (hereinafter referred to as an "I/O DRV") operated by CPU 1; the I/O DRV is connected to an interface device, through which signals are transferred to and from the external apparatus. Signals also are transferred through the I/O DRV to a spacing motor for moving a printing head along a print line (not shown) and also to a paper feed motor for feeding paper. Reference numeral 5 designates a printing head driver (hereinafter referred to as "HDRV"), and numeral 6 designates printing head which has twenty-four vertically aligned printing wires which are advanced by energization from the HDRV 5. Reference numeral 7 designates a bus line interconnecting the CPU, ROM, RAM and I/O DRV. Reference numeral 8 designates a bus line interconnecting the I/O DRV and HDRV.

Figure 2:
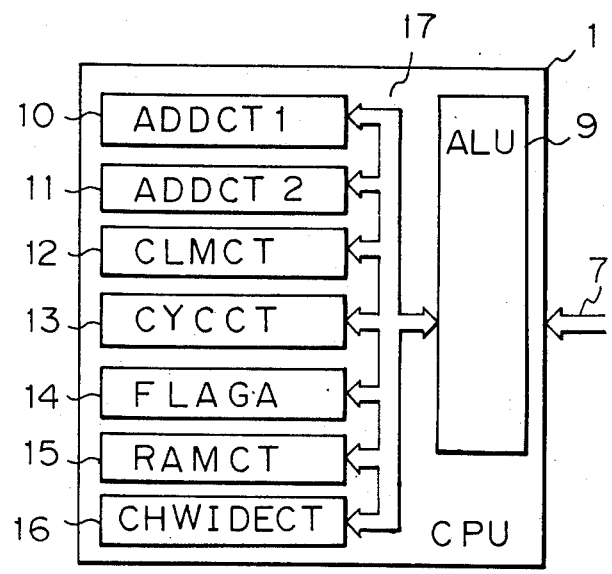
FIG. 2 is a block diagram showing a portion of the CPU shown in FIG. 1.

FIG. 2 is a block diagram showing a portion of the CPU shown in FIG. 1. Reference numeral 9 designates an arithmetic and logic unit (hereinafter referred to as an "ALU") which performs some arithmetic and logical operations. Reference numerals 10 and 11 designate address counters (hereinafter referred to as "ADDCT1" and "ADDCT2", respectively) for accessing the addresses of the ROM. Reference numerals 12, 13 and 14 designate a column counter, cycle counter and flag counter, respectively, for the ROM (hereinafter referred to as "CLMCT", "CYCCT" and FLAGA, respectively) for the converting pattern data to dot matrix patterns. Reference numerals 15 and 16 designate an address counter for RAM and a character width counter, respectively (hereinafter referred to as "RAMCT" and "CHWIDECT", respectively) for accessing the addresses of the RAM. Every counter noted above counts up to 8 bits and is reset to the initial count (e.g., "zero") according to some signals (e.g., a clock signal or a start or reset signal). Reference numeral 17 designates a bus line interconnecting the ALU 9, counters 10-13, 15, and 16, and FLAGA 14.

Figure 3:
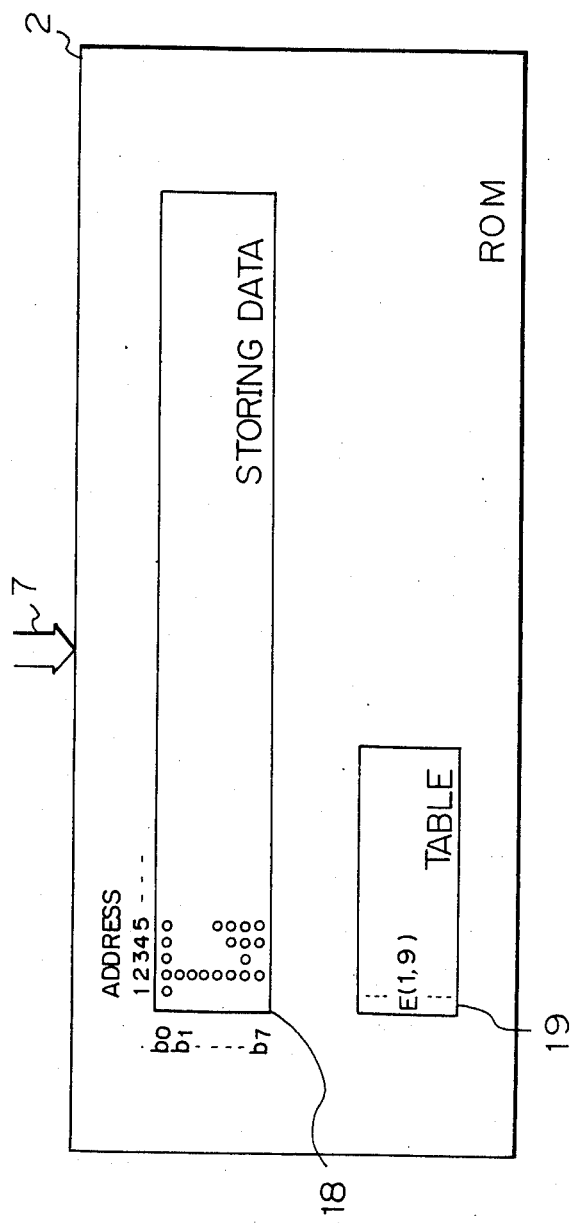
FIG. 3 is a block diagram showing a portion of ROM shown in FIG. 1.

FIG. 3 is a block diagram showing a portion of the ROM shown in FIG. 1. Reference numeral 18 designates a mixed area for storing pattern data and numerical data, in which one storage location is constituted by an eight-bit width (b0, b1, b2, ..., b7) by one-thousand-and-twenty-four-bit length or address (1, 2, ..., 1024). In the storage location, circles indicate logical value "1" while blanks indicate logical value "0" (these logical values being referred to as circles and blanks as above). Reference numeral 19 designates a conversion table, with reference to which pattern data is converted to dot matrix patterns. Element E(1,9) as shown means that the dot matrix pattern represents letter "E" and the start address of the ROM is "1" for ADDCT1 and "9" for ADDCT2.

Figure 4:
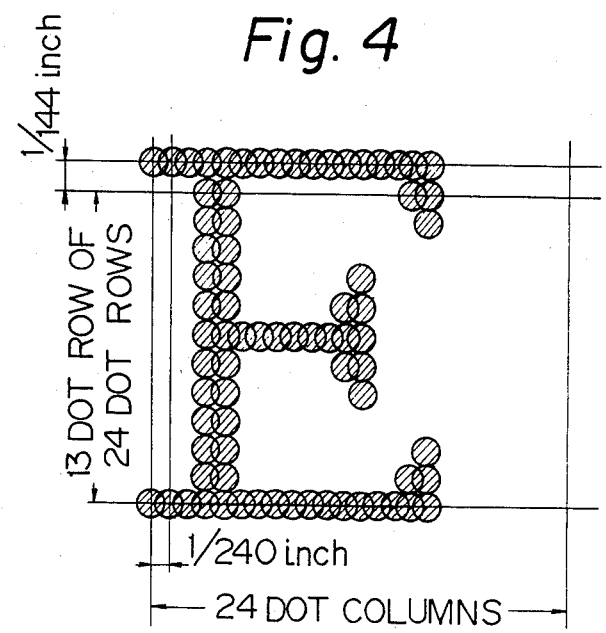
FIG. 4 is a view showing a print of a dot matrix pattern obtained by high-grade printing.

FIG. 4 shows a dot matrix pattern "E" printed by high-grade printing according to the present invention. The whole dot matrix pattern consists of twenty-four dot columns by twenty-four dot rows, but the character "E" is constituted by thirteen of the twenty-four dot rows and seventeen of the twenty-four dot columns, in this case. Adjacent printed dots, as shown shaded, partially overlay each other in the dot column direction by 1/240 inch spacing of the printing head which has twenty-four printing wires spaced apart in the vertical direction, while the printed dots do not overlay in the dot row direction in this case.

The character "E" will now be taken as an example of the dot matrix pattern for explanation of this embodiment.

Figure 5:
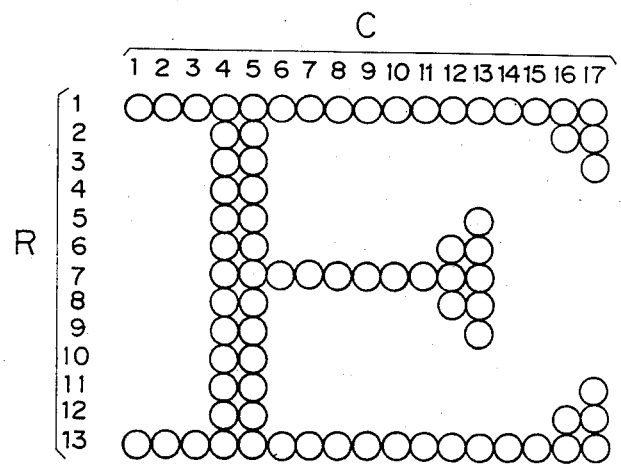
FIG. 5 is a view showing pattern data which is to be stored in a prior art memory device.
Figure 6:
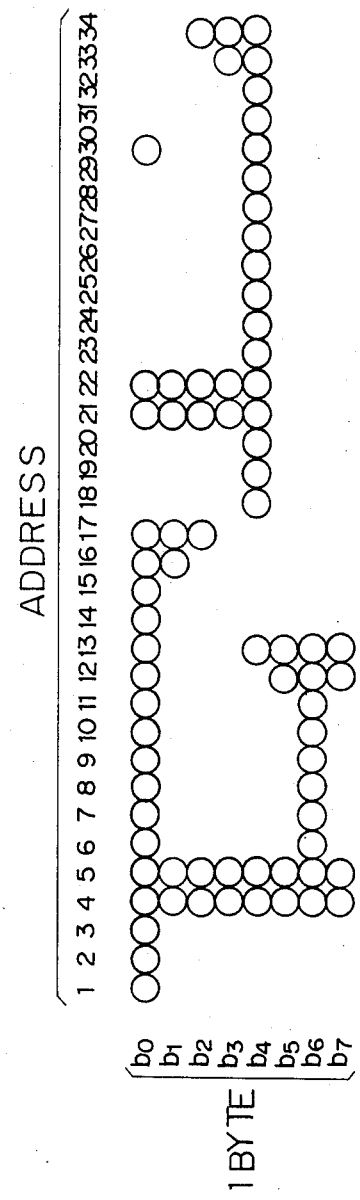
FIG. 6 is a view showing pattern data stored in the prior art memory device.

A prior art process of storing the character "E" in the ROM 2 will first be described with reference to FIGS. 4 to 6. The dot matrix pattern "E" as shown in FIG. 4 consists of a portion of a 17-by-13 dot matrix and, therefore, the storage location must have 17 and 13 positions in the column (C) and row (R) directions, respectively, as shown in FIG. 5. In this embodiment, the row (R) is divided into two portions i.e., an upper portion R1~R8 and a lower portion R9~R13. Information C1~C17 in the upper portion is stored in addresses 1 to 17, respectively, b0 to b7 of one byte in memory area of ROM 2 being assigned to the upper portion R1~R8, and likewise, information C1~C17 on the lower portion is stored in addresses 18 to 34, respectively, b0 to b4 of one byte in memory area of ROM 2 being assigned to the lower portion R9~R15, as shown in FIG. 6. Therefore, the memory area of b5 to b7 in addresses 18 to 34 is empty. The invention seeks to utilize this empty memory area for highgrade printing.

The improved process according to the invention will now be described. FIG. 5 illustrates some important information, i.e., information of each of columns C1 to C3 has continuous identical data. Likewise, information of each of columns C4 and C5, C6 to C11 and C14 and C15 has the continuous identical data. Therefore, the empty memory area of b5 to b7 is utilized for storing data specifying the total quantity of the continuous identical data.

Figure 7:
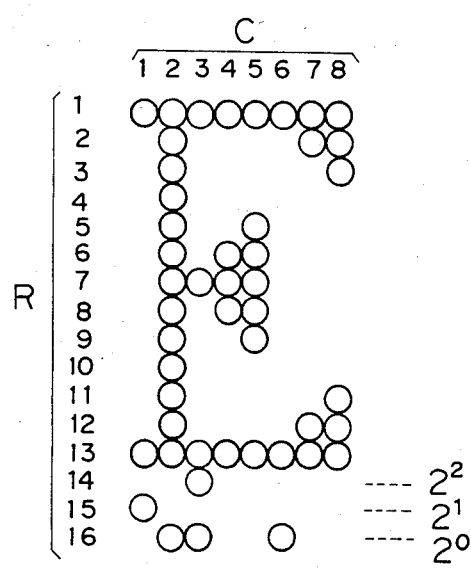
FIG. 7 is a view showing pattern data which is to be stored in a memory device according to the present invention.
Figure 8:
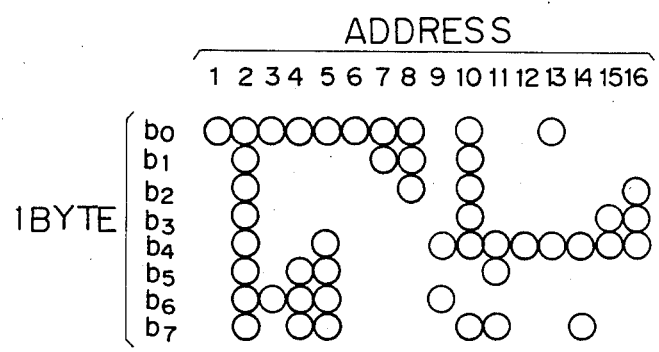
FIG. 8 is a view showing pattern data stored in the memory device according to the present invention.

FIG. 7 shows that the character "E" illustrated by the upper portion R1~R13 is a slim figure of the character "E" which is reduced in dimension in the column direction in FIG. 5. This slim character "E", however, is stretched back to the former character "E" according to the information in the lower portion of a figure as shown in FIG. 7. The lower portion, R14~R15, is given a weight of binary values $2^2$, $2^1$, and $2^0$, respectively. For example, the logical value "1" of (C1, R15) indicates further reception of the C1 information. FIG. 8 shows that the intermediate figure shown in FIG. 7 is stored in ROM 2, the circles and blanks indicating the logical values "1" and "0", respectively. The upper portion information in C1~C8 is stored in addresses 1 to 8, respectively, b0 to b7 of one byte in memory area of ROM 2 being assigned to the upper portion R1~R8, and likewise the lower portion information in C1~C18 is stored in addresses 9 to 16, respectively, b0 to b7 of one byte in memory area of ROM 2 being assigned to the lower portion R9~R16. Consequently, a 18 byte (34 bytes minus 16 bytes) reduction of the storing capacity is achieved by the improved process of this embodiment as shown in FIG. 8 in comparison to the prior art process as shown in FIG. 6. For example, the storing capacity of dot matrix pattern memory for the 96 types of ASCII CODE can be reduced by about 30% (1 K bytes) with this embodiment.

FIG. 9 is a block diagram showing a portion of the RAM shown in FIG. 1. Reference numerals 20 and 21 designate respective memory areas for storing a dot matrix pattern to be printed. The printing process of the printing system shown in FIG. 1 will now be described wtih reference to FIGS. 10 and 11. The character "E" is taken as an example which is printed.

Figure 10B:
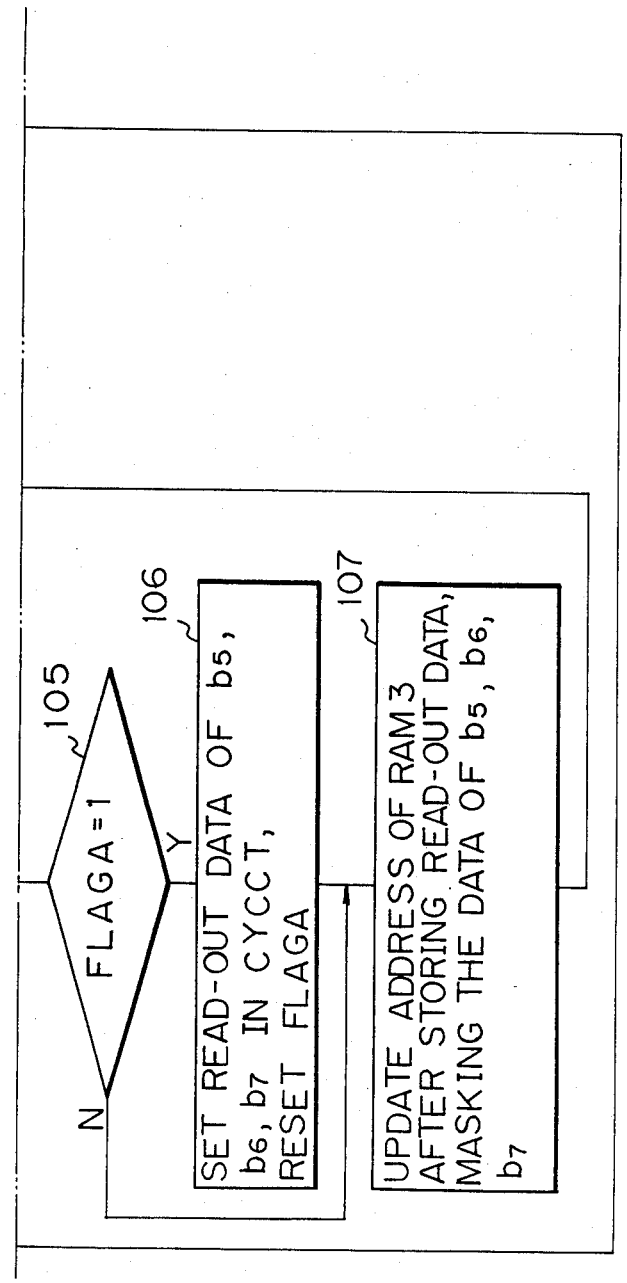

FIG. 10 comprising FIG. 10A and 10B, shows the conversion process. In step 101, start addresses "1" and "9" for ADDCT1 and ADDCT2, respectively, are read out from the element E(1,9) of the conversion table, and they are set. Numerical value "17" is set in CLMCT, because there are a total of 17 columns in FIG. 5. FLAGA is also set. In step 102, data in ROM 2 is read out with reference to ADDCT1. In step 103, the address of RAM 3 is updated after the read-out data is stored in RAM 3. In step 104, data in ROM 2 is read out with reference to ADDCT2. In step 105, a check is done as to whether FLAGA is "1" or "set". If FLAGA is "1", the routine goes to step 106. If not, the routine goes to step 107. In step 106, the read-out data of b5, b6 and b7 is set in CYCCT, and FLADA is reset. In the step 107, the address of RAM 3 is updated after the read-out data is stored, thus masking the data of b5, b6 and b7. In this step, the first column of the intermediate figure in FIG. 5 is set in RAM 3. Then through steps 108 through 110 and steps 102 through 107, the second column of the intermediate figure shown in FIG. 5 is set in RAM 3. In the step 109 it is detected that the value "0" of CYCCT means the end of the continuous identical data. In step 111, it is detected that the value "0" of CCMCT means the end of the read-out data and that the all print data as shown in FIG. 5 is set in RAM 3.

Figure 11:
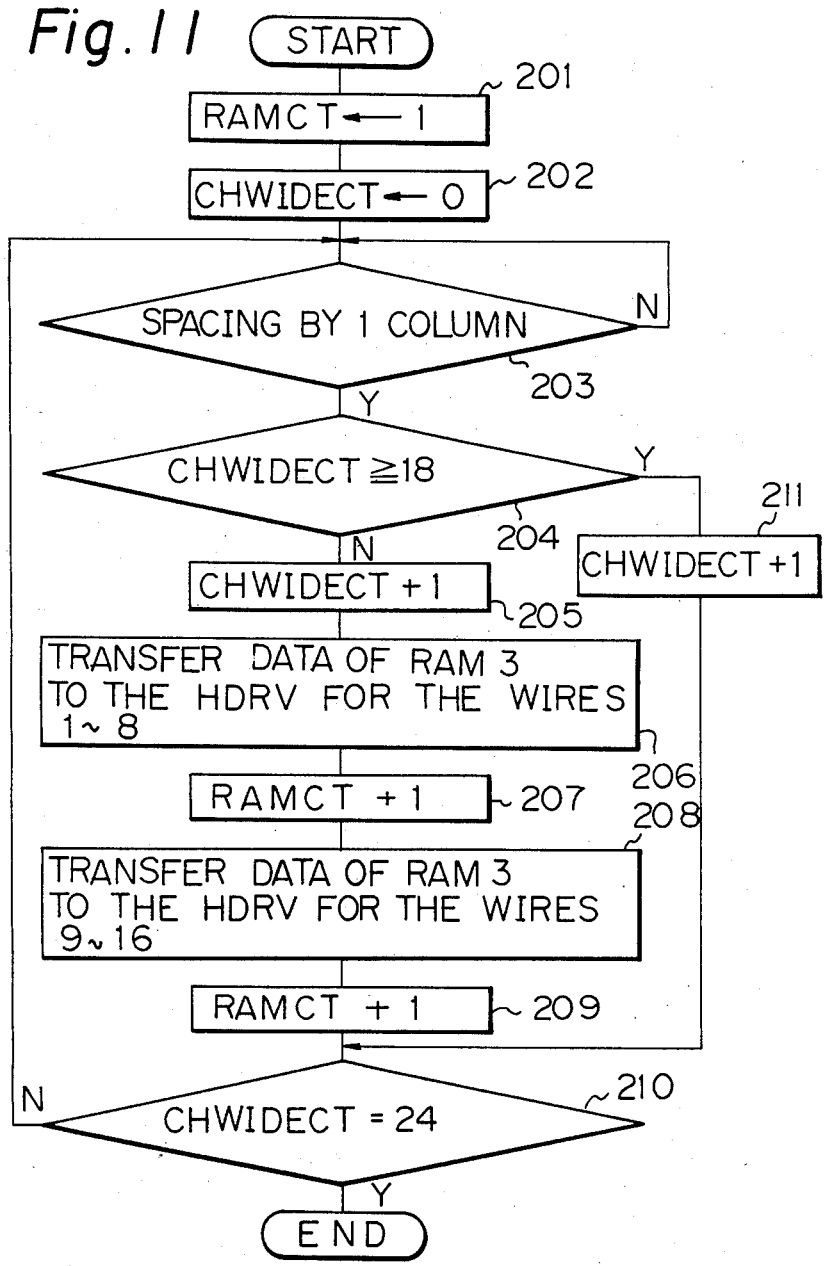
FIG. 11 is a flow chart illustrating a routine of the printing operation of a printing system according to the present invention.

FIG. 11 illustrates a printing operation. In step 201, value "1" is set in RAMCT. In step 202, value "0" is set in CHWIDECT. In step 203, a check is done as to whether printing head 6 is spaced by one column. If so, the routine goes to step 204. In the step 204, a check is done as to whether the data of CHWIDECT is not exceeding 18. If so, the routine goes to step 205. In the step 205, CHWIDECT is incremented by "1". In step 206 the data in RAM 3 is transferred to HDRV through I/O DRV for selectively energizing the printing wires 1 to 8 of the printing head 6. In step 207, RAMCT is incremented by "1". In step 208, the data of RAM 3 is transferred to HDRV through I/O DRV for selectively energizing the printing wires 9 to 16. Thus, the first column of the dot matrix pattern of character "E" is printed. In step 210, it is detected that value "24" means the end of printing.

The memory device according to the invention is applicable to a pattern display system, e.g., a CRT monitor, as well.

What is claimed is:

1. A printing system for a dot printer for printing matrix patterns in the form of aggregated dots, said matrix patterns consisting of orthogonal rows and columns, said system comprising:

a first memory means having first and second memory areas for storing pattern data corresponding to said rows and columns of said dot matrix patterns, wherein data corresponding to successive columns of each one of said dot matrix patterns are stored in said first memory area and numerical data specifying a total number of times each respective successive column is to be repeated in said respective pattern are stored in said second memory area;

a second memory means for temporarily storing said dot matrix patterns specified by said pattern data;

and a control means for causing said dot matrix patterns to be generated in said second memory means in accordance with said pattern data stored in said first memory means;

wherein, when two adjacent successive columns are identical, said first memory means need only once store data corresponding thereto so as to thereby reduce the amount of memory area needed for storing a dot matrix pattern having repeated identical successive columns and wherein specific bits of a pattern read from said first memory area of said first memory means are successively printed for a number of repetitions corresponding to numerical data stored in said second memory area of said first memory means.

2. A system as recited in claim 1, wherein said first memory means comprises a read only memory and said second memory means comprises a random access memory.

* * * * *